United States Patent
Terai

(10) Patent No.: US 8,300,448 B2
(45) Date of Patent: Oct. 30, 2012

(54) SEMICONDUCTOR STORAGE DEVICE, MEMORY CELL ARRAY, AND A FABRICATION METHOD AND DRIVE METHOD OF A SEMICONDUCTOR STORAGE DEVICE

(75) Inventor: Masayuki Terai, Tokyo (JP)

(73) Assignee: NEC Corporation, Tokyo (JP)

( * ) Notice: Subject to any disclaimer, the term of this patent is extended or adjusted under 35 U.S.C. 154(b) by 104 days.

(21) Appl. No.: 12/922,783

(22) PCT Filed: Mar. 24, 2009

(86) PCT No.: PCT/JP2009/055737
§ 371 (c)(1),
(2), (4) Date: Sep. 15, 2010

(87) PCT Pub. No.: WO2009/119533
PCT Pub. Date: Oct. 1, 2009

(65) Prior Publication Data
US 2011/0157959 A1    Jun. 30, 2011

(30) Foreign Application Priority Data

Mar. 25, 2008 (JP) .................................. 2008-079069

(51) Int. Cl.
*G11C 27/00* (2006.01)
(52) U.S. Cl. ...................... 365/148; 365/185.05; 365/46; 257/47; 257/E21.18; 257/21.21
(58) Field of Classification Search .................. 365/148, 365/185.05, 46; 257/14, E21.18, E21.21
See application file for complete search history.

(56) References Cited

U.S. PATENT DOCUMENTS

| 7,102,192 | B2 * | 9/2006 | Ono ............................. 257/316 |
| 7,955,933 | B2 * | 6/2011 | Fujii et al. .................... 438/287 |
| 8,049,204 | B2 * | 11/2011 | Ito ................................. 257/14 |
| 2005/0036366 | A1 * | 2/2005 | Ono ........................ 365/185.01 |
| 2008/0106924 | A1 * | 5/2008 | Cho et al. ..................... 365/148 |

FOREIGN PATENT DOCUMENTS

| JP | 3-166765 | A | 7/1991 |
| JP | 5-190847 | A | 7/1993 |
| JP | 11-17184 | A | 1/1999 |
| JP | 11-26608 | A | 1/1999 |
| JP | 2004185754 | A | 7/2004 |
| JP | 2004272975 | A | 9/2004 |
| JP | 3683895 | B | 8/2005 |
| JP | 2007115956 | A | 5/2007 |
| JP | 2007294925 | A | 11/2007 |

OTHER PUBLICATIONS

International Search Report for PCT/JP2009/055737 mailed Jun. 23, 2009.

* cited by examiner

*Primary Examiner* — Connie Yoha

(57) ABSTRACT

A semiconductor storage device is provided for solving the problem of the inability to simultaneously realize high reliability and decreased cell area. A selection electrode (106) is formed to sandwich an insulating film (105) with a p-type semiconductor region (102). A first n-type semiconductor region (103) and a second n-type semiconductor region (104) are formed in the p-type semiconductor region (102) at two sides of the selection electrode (106). A first resistance-changing layer (107) is connected to the first n-type semiconductor region (103), and a second resistance-changing layer (109) is connected to the second n-type semiconductor region (104). In addition, a first wiring layer (108) is connected to the second resistance-changing layer (109), and a second wiring layer (110) is connected to the second resistance-changing layer (109).

18 Claims, 13 Drawing Sheets

101: semiconductor substrate
102: p-type semiconductor region
103: first n-type semiconductor region
104: second n-type semiconductor region
105: insulating film
106: selection electrode
107: first resistance-changing layer
108: first wiring layer
109: second resistance-changing layer
110: second wiring layer 101: semiconductor substrate
102: p-type semiconductor region
103: first n-type semiconductor region
104: second n-type semiconductor region
105: insulating film
106: selection electrode
107: first resistance-changing layer
108: first wiring layer
109: second resistance-changing layer
110: second wiring layer 111: first via layer
112: first resistance-changing layer
113: second via layer
114: second resistance-changing layer 119:first resistance-changing layer
120:second resistance-changing layer 121:insulating film
122:embedded selection electrode

SEMICONDUCTOR STORAGE DEVICE, MEMORY CELL ARRAY, AND A FABRICATION METHOD AND DRIVE METHOD OF A SEMICONDUCTOR STORAGE DEVICE

TECHNICAL FIELD

The present invention relates to a semiconductor storage device, a memory cell array, and a fabrication method and drive method of a semiconductor storage device, and more particularly to a resistance-changing semiconductor storage device, a memory cell array, and the fabrication method and drive method of a semiconductor storage device.

BACKGROUND ART

Flash memory up to the 0.13 μm generation employ FG memory elements that use floating gates (FG) as electron-capture layers that save information by capturing electrons. In addition, miniaturization of FG memory elements chiefly involved the reduction of cell area and thinning of insulating films. In flash memory of the 90-nm generation and beyond, however, thinner insulating films are problematic from the standpoint of retaining information. As a result, trap-type memory elements that hold information by trapping electrons in an insulating film are receiving attention in place of FG memory elements.

A trap-type memory element has the advantages of enabling a greater reduction of the equivalent oxide thickness equivalent thickness than an FG memory element and having a simpler device configuration than an FG memory element. The reduction of the equivalent oxide thickness equivalent thickness includes the thinning of tunnel oxide films.

A trap-type memory element uses the locality of electrons to enable writing of two or more bits of information per cell. As a result, a trap-type memory element is able to reduce cell area per bit and can decrease the fabrication costs of flash memory.

FIG. 1 is a sectional view of an example of the configuration of a trap-type memory element. As shown in FIG. 1, in a trap-type memory element, gate electrode 5 is formed to sandwich trap insulating film 4 on the channel region of p-type semiconductor substrate 1. In addition, n-type source-drain regions 2 and 3 are formed at two sides of gate electrode 5 in p-type semiconductor substrate 1. Source-drain regions 2 and 3 are diffusion regions, one being a source and the other being a drain. In source-drain regions 2 and 3, the source and drain are switched in the write state and read state. In addition, the vicinities on both ends of gate electrode 5 are the electron accumulation regions of memory nodes A and B. A layered construction of oxide film/nitride film/oxide film is normally used for trap insulating film 4.

FIG. 2 is an explanatory view for describing an example of the operation of a trap-type memory element.

When memory node A is to be placed in the write state, a positive voltage is applied to each of source-drain region 2 and gate electrode 5. In this case, channel hot electrons (CHE) are produced in the vicinity of memory node A and the electrons are implanted into trap insulating film 4 in the vicinity of memory node A. Electrons are thus accumulated in trap insulating film 4 and memory node A enters the write state.

When memory node A is to be placed in the delete state, a positive voltage is applied to source-drain region 2 and a negative voltage is applied to gate electrode 5. In this case, hot holes are produced as a result of interband tunneling in the vicinity of memory node A. These hot holes are implanted into trap insulating film 4, whereby the electrons that were accumulated in trap insulating film 4 are neutralized and memory node A enters the delete state.

When information is to be read from memory node A, a positive voltage is applied to both source-drain region 3 and gate electrode 5, and the current value between source-drain regions 2 and 3 is read. When electrons are accumulated in memory node A, flat band voltage in the vicinity of source-drain region 2 that is the source shifts towards positive, whereby the current value between source-drain regions 2 and 3 drops. When this current value is less than a predetermined value, memory node A is determined to be in the write state, and when this current value is equal to or greater than the predetermined value, memory node A is determined to be in the delete state, the state of the memory being thus identified.

When memory node B is to be placed in the write state, a positive voltage is applied to source-drain region 3 and gate electrode 5, whereby channel hot electrons are produced in the vicinity of memory node B and electrons are implanted and accumulated in trap insulating film 4 in the vicinity of memory node B. When memory node B is to be placed in the delete state, a positive voltage is applied to source-drain region 3 and a negative voltage is applied to gate electrode 5, whereby hot holes resulting from interband tunneling are generated in the vicinity of memory node B and accumulated electrons are neutralized. On the other hand, when memory node B is to be placed in the read state, a positive voltage is applied to each of source-drain region 2 and gate electrode 5 and the current value between source-drain regions 2 and 3 is read.

However, because a hot carrier is implanted into trap insulating film 4 when information is read in a trap-type memory element of this type, a problem (Read Disturb) arises in which the amount of electrons that are accumulated changes as the number of times information is read increases, resulting in a change of the information that is stored.

More specifically, as shown in FIG. 2, when information is to be read from memory node A, a positive voltage is applied to source-drain region 3 and gate electrode 5, but a small number of channel hot electrons are produced in the vicinity of memory node B. As a result, when memory node B is in the delete state and information is read from memory node A a large number of times, the delete state changes to the write state and memory node B malfunctions. When information is read from memory node B a great number of times, the state of memory node A changes.

Writing and deletion of information is carried out by the implantation of hot electrons and hot holes into trap insulating film 4, and this leads to the problem of the deterioration of trap insulating film 4 and the deterioration of the capability to retain electrons when the writing and deletion of information is carried out repeatedly. This problem occurs because trap-type insulating film 4 also serves as the insulating film of gate electrode 5.

To fundamentally solve this problem, trap insulating film 4 that is the storage area must be isolated from the channel region in which the hot carrier is produced. However, when trap insulating film 4 is isolated from the channel region in which the hot carrier is produced, the trap-type memory is unable to accumulate electrons and therefore cannot record information.

This occurrence of read Disturb and the deterioration of the retaining capability results in the decrease of reliability in a trap-type memory element.

A resistance-changing memory element is a memory element that provides a solution to this problem of low reliability, and resistance-changing memory elements are now receiving attention as flash memory memory elements of the 65 nm generation and beyond.

FIG. 3 is a sectional view showing an example of the construction of a resistance-changing memory element. In FIG. 3, the resistance-changing memory element includes: semiconductor substrate 11 in which drain region 12 and source region 13 are formed; insulating film 16 that is formed on semiconductor substrate 11; gate electrode 15 that is formed on insulating film 16; resistance-changing layer 17 that is connected to drain region 12; and wiring layer 18 that is connected to resistance-changing layer 17. Insulating film 16 is formed of a material that does not trap electrons.

In resistance-changing layer 17, an MIM (Metal/Insulator/Metal) structure is typically used in which a transition metal oxide such as nickel oxide (NiO), vanadium oxide ($V_2O_5$), zinc oxide (ZnO), titanium dioxide ($TiO_2$), or tungsten trioxide ($WO_3$) is sandwiched by a metal such as titanium nitride (TiN), platinum (Pt), or ruthenium (Ru).

FIG. 4 is a block diagram showing an example of the configuration of a memory cell array that uses resistance-changing memory elements. This memory cell array is described in, for example, Patent Document 1.

As shown in FIG. 4, in a memory cell array that uses resistance-changing memory elements, column decoder 31 is connected to n bit-lines BL1, BL2, BL3, . . . , BL(n), and word decoder 32 is connected to m word lines WL1, WL2, . . . , WL(m).

Each of bit-lines BL1-BL(n) is arranged to intersect with each of word-lines WL2-WL(m), and resistance-changing memory elements 33 are arranged at these intersections. Here, wiring layer 18 of resistance-changing memory element 33 is connected to a bit-line, and gate electrode 15 of resistance-changing memory element 33 is connected to a word-line. FIG. 4 further shows variable resistance 34 realized by resistance-changing layer 17.

Writing and deletion of information to this resistance-changing memory element 33 is realized by applying a positive voltage to wiring layer 18 and gate electrode 15 and by adjusting the current that flows from source region 13 by way of drain region 12 to resistance-changing layer 17. Reading information from resistance-changing memory element 33 is realized by applying a positive voltage to wiring layer 18 and gate electrode 15 and reading the current that flows between drain region 12 and source region 13 that changes according to the resistance value of resistance-changing layer 17. However, the voltage that is applied to wiring layer 18 during reading is a positive voltage and is lower than the voltage applied to wiring layer 18 during writing.

When a resistance-changing memory element is used, resistance-changing layer 17 that is the storage region does not further serve as the gate insulating film of gate electrode 15, and further, is sufficiently separated from the channel region. As a result, the problem of reduced reliability such as the read Disturb that results from hot electrons and hot holes and the drop in retaining capabilities can be solved. Further, the elimination of the need to generate a hot carrier during deletion enables a reduction of the operating voltage.

Patent Document 1: JP-A-2004-185754

DISCLOSURE OF THE INVENTION

Problem to be Solved by the Invention

In a resistance-changing memory element, the need for source region 13 allows the formation of only one storage region in one memory cell (more specifically, gate electrode 15). Accordingly, the cell area per bit in a resistance-changing memory element is greater than that of a trap-type memory that has two storage regions for one memory cell. In other words, from the standpoint of cost reduction realized by the reduction of cell area, a resistance-changing memory element is inferior to a trap-type memory element.

On the other hand, the occurrence of read Disturb and the drop in retaining capabilities in a trap-type memory element results in a decrease in reliability.

The problem therefore arises that high reliability and decreased cell area cannot be simultaneously achieved in a resistance-changing memory element and trap-type memory element.

It is an object of the present invention to provide a semiconductor storage device, a memory cell array, and a fabrication method and drive method of a semiconductor storage device that can solve the problems that prevent simultaneous realization of high reliability and decreased cell area.

Means for Solving the Problem

The semiconductor storage device according to the present invention includes: a semiconductor region of a first conductivity type; a selection electrode connected with the semiconductor region with an insulating film interposed; a first semiconductor region and second semiconductor region of a second conductivity type formed in the semiconductor region at two sides of the selection electrode; a first resistance-changing layer connected to the first semiconductor region; a second resistance-changing layer connected to the second semiconductor region; a first wiring layer connected to the first resistance-changing layer; and a second wiring layer connected to the second resistance-changing layer.

The memory cell array according to the present invention is a memory cell array that includes the above-described semiconductor storage devices as unit memory cells, and in addition, a plurality of bit-lines, and a plurality of word-lines; a plurality of the unit memory cells being lined in each of the direction of extension of the bit-lines and the direction of extension of the word-lines, the selection electrode of each memory cell being connected to a word-line, the first wiring layer and second wiring layer of each memory cell being connected to a bit-line, and the semiconductor regions of a plurality of unit memory cells of the unit memory cells being linked and having electrical continuity with each other.

The fabrication method of a semiconductor storage device according to the present invention includes: a first step of forming a semiconductor region of a first conductivity type in a semiconductor layer; a second step of forming a selection electrode that connects with the semiconductor region with an insulating film interposed and forming a first semiconductor region and second semiconductor region of a second conductivity type in the semiconductor region on two sides of the selection electrode; a third step of forming a first resistance-changing layer on the first semiconductor region and forming a second resistance-changing layer on the second semiconductor region; and a fourth step of forming a first wiring layer on the first resistance-changing layer and forming a second wiring layer on the second resistance-changing layer.

The drive method of a semiconductor storage device according to the present invention is a drive method of the above-described semiconductor storage device and carries out reading or writing of information by taking the potential of the semiconductor region as a reference potential, by applying a read voltage of reversed polarities to the selection electrode and the first wiring layer or the second wiring layer that is connected to, of the first resistance-changing layer and the second resistance-changing layer, the resistance-changing layer that implements reading or writing of information.

Effect of the Invention

The present invention enables both higher reliability and decreased cell area.

BEST MODE FOR CARRYING OUT THE INVENTION

Exemplary embodiments of the present invention are next described with reference to the accompanying figures.

First Exemplary Embodiment

Figure 1:
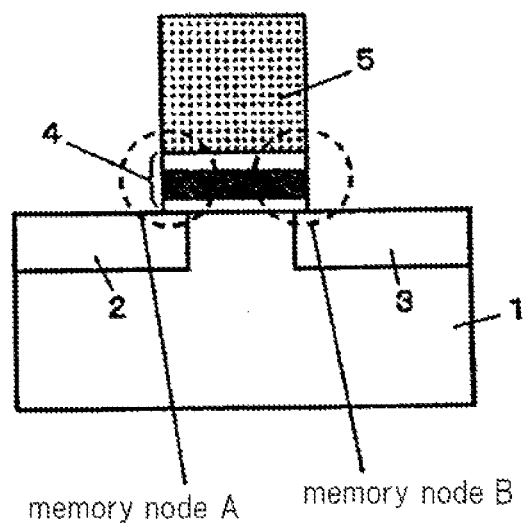
FIG. 1 is a sectional view showing an example of the construction of a trap-type memory element.
Figure 2:
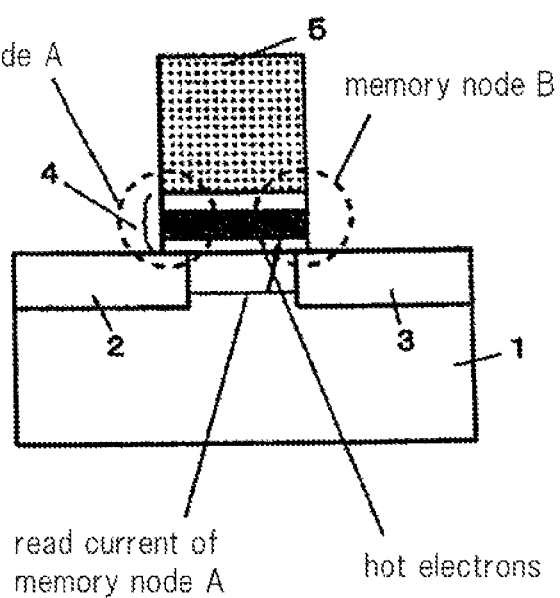
FIG. 2 is an explanatory view for describing an example of the operation of a trap-type memory element.
Figure 3:
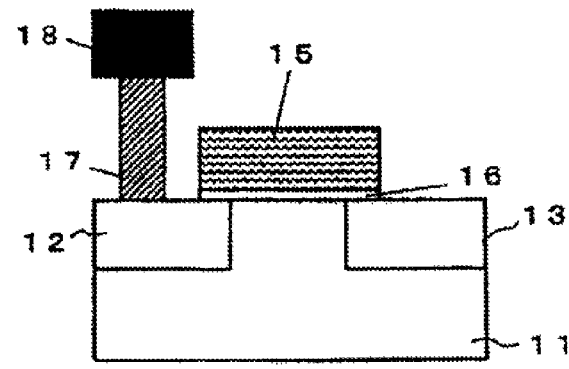
FIG. 3 is a sectional view showing an example of the construction of a resistance-changing memory element.
Figure 4:
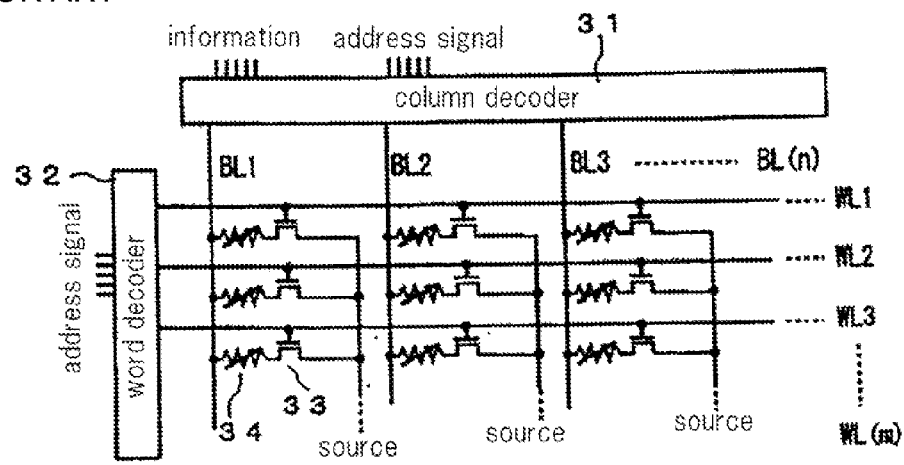
FIG. 4 is a structural view that shows an example of the construction of a memory cell array that uses resistance-changing memory elements.
Figure 5:
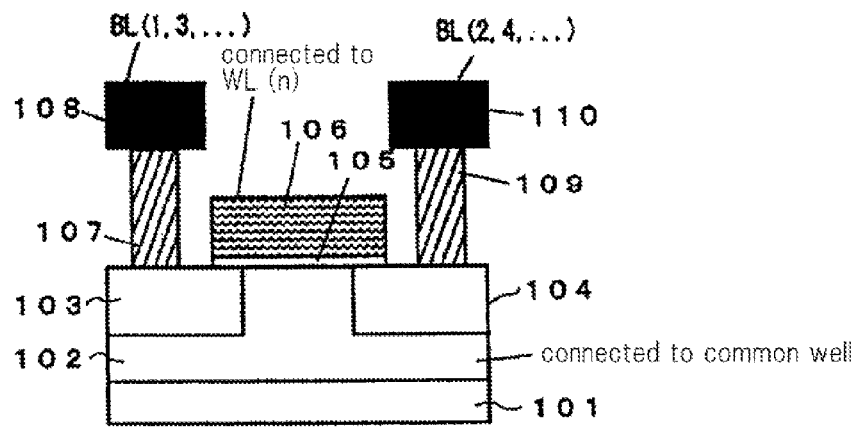
FIG. 5 is a sectional view showing the construction of the semiconductor storage device of the first exemplary embodiment.

FIG. 5 is a sectional view showing the construction of the semiconductor storage device of the first exemplary embodiment of the present invention. As shown in FIG. 5, in the semiconductor storage device of the present exemplary embodiment, p-type semiconductor region 102 is formed in semiconductor substrate 101 that is a semiconductor layer, and selection electrode 106 is further formed over this p-type semiconductor region 102 with insulating film 105 interposed. In addition, first n-type semiconductor region 103 and second n-type semiconductor region 104 are realized by self-aligning formation in p-type semiconductor region 102 on both sides of selection electrode 106.

First resistance-changing layer 107 is connected to first n-type semiconductor region 103, and second resistance-changing layer 109 is connected to second n-type semiconductor region 104. First wiring layer 108 is further connected to second resistance-changing layer 109, and second wiring layer 110 is connected to second resistance-changing layer 109. First wiring layer 108 is thus connected to n-type semiconductor region 103 with first resistance-changing layer 107 interposed, and second wiring layer 110 is connected to n-type semiconductor region 104 with second resistance-changing layer 109 interposed.

Figure 6:
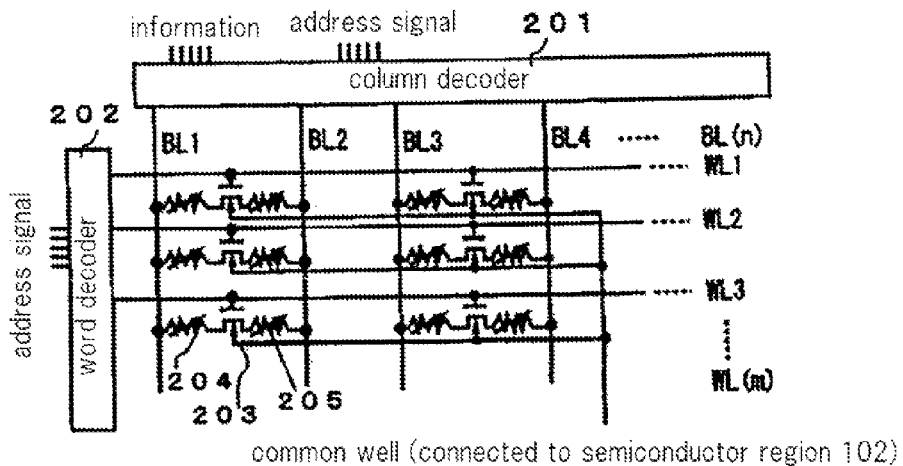
FIG. 6 is a structural view showing an example of the construction of a memory cell array that uses semiconductor storage devices of the first exemplary embodiment.

FIG. 6 is a block diagram showing an example of the configuration of a memory cell array that includes the semiconductor storage device shown in FIG. 5 as unit memory cells.

In FIG. 6, a semiconductor storage device that is the unit memory cell is represented by transistor 203 and variable resistance elements 204 and 205. Variable resistance element 204 represents first resistance-changing layer 107, and variable resistance element 205 represents second resistance-changing layer 109. In addition, transistor 203 represents a transistor that takes selection electrode 106 as gate and n-type semiconductor regions 103 and 104 as source and drain, respectively.

In FIG. 6, the memory cell array includes n bit-lines BL1, BL2, BL3, . . . , BL(n), m word-lines WL1, WL2, . . . , WL(m), column decoder 201, word decoder 202, and a plurality of unit memory cells. In addition, n and m are integers equal to or greater than 2. In other words, there is a plurality of bit-lines and word-lines.

Each of bit-lines BL1, BL2, BL3, . . . BL(n) extend in a vertical direction. Each of word-lines WL1, WL2, . . . , WL(m) extend in a horizontal direction. Column decoder 201 is connected in parallel to bit-lines BL1, BL2, BL3, . . . , BL(n), and word decoder 202 is connected in parallel to word-lines WL1, WL2, . . . , WL(m).

A plurality of unit memory cells is aligned in each a vertical direction that is the direction of extension of bit-lines BL1, BL2, BL3, . . . , BL(n) and in each a horizontal direction that is the direction of extension of word-lines WL1, WL2, . . . , WL(m).

Selection electrode 106 of a unit memory cells is connected to a word-line. Wiring layer 108 is connected to one of two adjacent bit-lines, and wiring layer 110 is connected to the other of two adjacent bit-lines.

More specifically, one bit-line of two adjacent bit-lines BL1 and BL2 (assumed to be odd-numbered bit-line BL1) is connected to wiring layer 108 of each unit memory cell of the first column, and the other bit-line (assumed to be even-numbered bit-line BL2) is connected to wiring layer 110 of each memory cell of the first column. Similarly, each of the odd-numbered bit-lines and even-numbered bit-lines of other adjacent pairs of bit-lines BL2-BL(n) are connected to wiring layer 108 and 110, respectively, of each unit memory cell aligned in the same columns.

Word-line WL1 is connected in common to selection electrode 106 of each unit memory cell aligned horizontally in the first row. Similarly, each of other word-lines WL2-WL(m) is connected in common to selection electrode 106 of each unit memory cell that is aligned horizontally in the second to $m^{th}$ rows.

P-type semiconductor regions 102 of the plurality of adjacent memory cells are linked and have electrical continuity with each other. These linked p-type semiconductor regions 102 are connected to common well interconnect, whereby the plurality of unit memory cells can be connected to a single common well interconnect and the overall area of memory cells can be decreased.

The materials of each part of the semiconductor storage device are next described.

Insulating film 105 is preferably formed of a material that does not trap electrons. For example, insulating film 105 is preferably formed by silicon dioxide ($SiO_2$), nitrided silicon oxide (SiON), hafnium oxide ($HfO_2$), hafnium silicate (HfSiO), nitrided hafnium silicate (HfSiON), aluminum trioxide ($Al_2O_3$), or zirconium dioxide ($ZrO_2$). In the following explanation, a film formed of $SiO_2$ ($SiO_2$ film) is used as insulating film 105.

In addition, an n-type polycrystalline silicon with added phosphorus is used as selection electrode 106.

An MIM construction in which a transition metal oxide such as nickel oxide (NiO, vanadium oxide ($V_2O_5$), zinc oxide (ZnO), zirconium dioxide ($ZrO_2$), titanium dioxide ($TiO_2$), or tungsten trioxide ($WO_3$) is sandwiched by a metal such as titanium nitride (TiN), tantalum nitride (TaN), platinum (Pt), or ruthenium (Ru) is preferably used for each of resistance-changing layers 107 and 109. In the following explanation, an MIM structure in which $TiO_2$ is sandwiched by TiN is employed for each of resistance-changing layers 107 and 109.

Aluminum (Al) is used as wiring layers 108 and 110.

The p-type impurity concentration of p-type semiconductor region 102 and the n-type impurity concentration of each of n-type semiconductor regions 103 and 104 are preferably high concentrations of at least $1E+18$ cm$^{-2}$ at the peaks of the impurity concentrations, and more preferably are at least $1E+19$ cm$^{-2}$. In particular, a high concentration and steep impurity concentration profile is preferably formed at the PN junction below selection electrode 106 in each of p-type semiconductor region 102 and n-type semiconductor regions 103 and 104.

Figure 7:
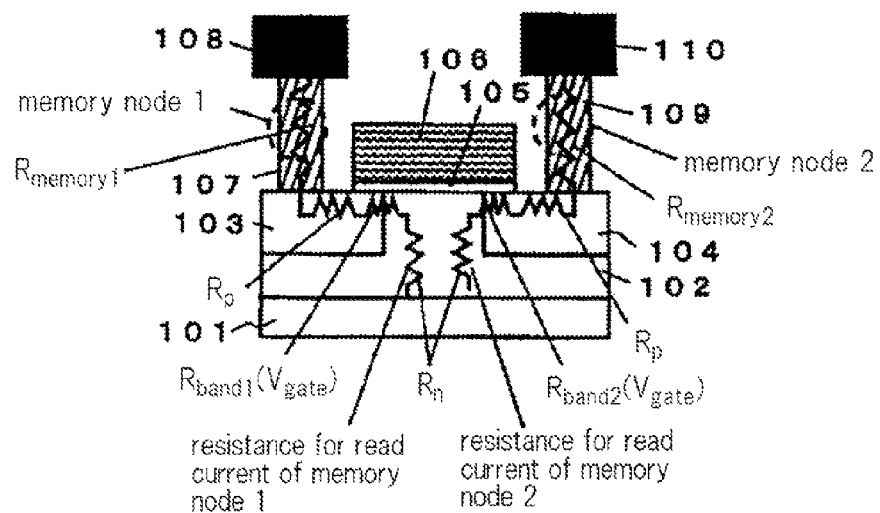
FIG. 7 is an explanatory view for describing the operation of the semiconductor storage device of the first exemplary embodiment.

The drive method of the semiconductor storage device when reading information is next described. FIG. 7 is an explanatory view for describing this operation of reading information.

First, taking the potential of p-type semiconductor region 102 as the reference potential, voltages of reversed polarity are applied to selection electrode 106 and wiring layer 108 or 110 that is connected to the resistance-changing layer of resistance-changing layers 107 and 109 from which information is read by reading the resistance value. More specifically, positive voltage is applied to wiring layer 108 or 110 and negative voltage is applied to selection electrode 106.

In the following explanation, the resistance-changing layer from which a resistance value is read is assumed to be resistance-changing layer 107. In this case, the wiring layer to which a positive voltage is applied becomes wiring layer 108. In addition, bit-line BL(n) is further assumed to be connected to wiring layer 108, and word-line WL(m) is assumed to be connected to selection electrode 106. Accordingly, column decoder 201 shown in FIG. 6 applies positive voltage to wiring layer 108 by way of bit-line BL(n), and word decoder 202 applies a negative voltage to selection electrode 106 by way of word-line WL(m).

When the above-described voltages are applied to wiring layer 108 and selection electrode 106, interband tunnel current flows in the PN junction of p-type semiconductor region 102 and n-type semiconductor region 103 under selection electrode 106, as shown in FIG. 7. The resistance (Rband 1) between p-type semiconductor region 102 and n-type semiconductor region 103 therefore drops and current flows between wiring layer 108 and p-type semiconductor region 102.

The value of this current (hereinbelow referred to as the "read current value") is greatly dependent on the resistance value (Rmemory 1) of resistance-changing layer 107. As a result, the resistance value of resistance-changing layer 107 can be read by measuring this read current value. A Set state in which information is recorded in resistance-changing layer 107 is assumed when this resistance value is equal to or greater than a predetermined value, and a Reset state in which information is not recorded in resistance-changing layer 107 is assumed when this resistance value is less than the predetermined value.

An impurity concentration of p-type semiconductor region 102 below selection electrode 106 that is at least 1E+18 cm$^{-2}$ can prevent malfunctioning between adjacent memory nodes that arises from punch-through current that flows from n-type semiconductor region 103 to n-type semiconductor region 104 when a positive voltage is applied to wiring layer 108.

The interband tunnel current is greatly dependent on the steepness of the impurity profile and the impurity concentration of p-type semiconductor region 102 and n-type semiconductor region 103 in the vicinity of the PN junction below selection electrode 106. When the impurity profile is steep and the impurity concentration of p-type semiconductor region 102 and n-type semiconductor region 103 are both equal to or greater than 1E+18 cm$^{-2}$, an interband tunnel current sufficient for the read operation can be caused to flow.

When the impurity concentrations of p-type semiconductor region 102 and n-type semiconductor region 103 are at least 1E+19 cm$^{-2}$, resistance value Rp of p-type semiconductor region 102 and resistance value Rn of n-type semiconductor region 107 that are parasitic resistance are reduced to a negligible level with respect to resistance-changing layer 107. As a result, the read current value can be increased when resistance-changing layer 107 is in the Reset state. In particular, in the present exemplary embodiment, p-type semiconductor region 102 is common to a plurality of unit memory cells and the connection position to common well wiring is separated from each unit memory cell, whereby reduction of resistance value Rp by changing the impurity concentration to a high concentration of at least 1E+19 cm$^{-2}$ is effective. In the present exemplary embodiment, increase of the read current in the Reset state enables higher memory speed.

The drive method of the semiconductor storage device when writing information is next described.

First, taking the potential of p-type semiconductor region 102 as the reference potential, voltages of mutually reversed polarities are applied to selection electrode 106 and wiring layer 108 or 110 that is connected to the resistance-changing layer of resistance-changing layers 107 and 109 to which information is written by writing a resistance value. More specifically, a positive voltage is applied to wiring layer 108 or 110, and a negative voltage is applied to selection electrode 106. A positive voltage that is higher than the voltage that was applied when reading information is applied to wiring layer 108 or 110, and a negative voltage that is lower than the voltage applied when reading information is applied to selection electrode 106. In this way, a current that is larger than when reading flows through resistance-changing layer 107 or 109. This larger current causes resistance-changing layer 107 or 109 to change from the Set state to the Reset state or from the Reset state to the Set state.

The effect is next described.

In the present exemplary embodiment, p-type semiconductor region 102 and selection electrode 106 are formed with insulating film 105 interposed. First n-type semiconductor region 103 and second n-type semiconductor region 104 are formed in p-type semiconductor region 102 on two sides of selection electrode 106. First resistance-changing layer 107 is connected to first n-type semiconductor region 103, and second resistance-changing layer 109 is connected to second n-type semiconductor region 104. First wiring layer 108 is connected to second resistance-changing layer 109, and second wiring layer 110 is connected to second resistance-changing layer 109.

In this case, n-type semiconductor regions 103 and 104 are formed in p-type semiconductor region 102. Resistance-changing layer 107 is connected to n-type semiconductor region 103, and resistance-changing layer 109 is connected to n-type semiconductor region 104. Accordingly, in contrast to a trap-type memory element, resistance-changing layers 107 and 109 that have the capability to hold information can be isolated from p-type semiconductor region 102 that generates a hot carrier. As a result, a reduction of reliability such as read Disturb or the deterioration of retaining capability can be avoided.

In addition, by applying a voltage to selection electrode 106 and wiring layer 108 or 110, the interband tunnel current that flows in the PN junction that is formed between p-type semiconductor region 102 and n-type semiconductor region 103 under selection electrode 106 can be used to implement the writing and reading of memory information. Thus, in contrast to a resistance-changing memory element that uses current that flows between the source and drain, a source region need not be provided in the memory element. As a result, two storage regions can be formed for a single memory cell, and the cell area per bit can be reduced.

In other words, the present exemplary embodiment enables the simultaneous realization of both higher reliability and reduced cell area per bit.

In the present exemplary embodiment, moreover, a memory cell array includes as unit memory cells semiconductor storage devices that can realize both higher reliability and reduced cell area per bit and therefore can realize both higher reliability and reduced cell area of the memory cell array.

In the present exemplary embodiment, p-type semiconductor regions 102 of each unit memory cell in a memory cell array are linked, and further, have electrical continuity. In this case, p-type semiconductor regions 102 of each unit memory cell can be connected to a single common well interconnect and the area of the memory cell array can thus be reduced.

The fabrication method of the semiconductor storage device is next described.

Boron is first ion-implanted into a predetermined region of semiconductor substrate 101 and this region then activated to form this region as p-type semiconductor region 102. The dosage of the boron that is ion-implanted is assumed to be 2E+15 cm$^{-2}$.

Selection electrode 106 that connects to p-type semiconductor region 102 is formed with insulating film 105 interposed. More specifically, insulating film 105 of $SiO_2$ and phosphorus-doped polycrystalline silicon are deposited on p-type semiconductor region 102 and an exposure step and dry-etching step are used to pattern this phosphorus-doped polycrystalline silicon to form the phosphorus-doped polycrystalline silicon as selection electrode 106.

Next, n-type semiconductor regions 103 and 104 are formed in p-type semiconductor region 102 on two sides of selection electrode 106. More specifically, using selection electrode 106 as a mask, phosphorus is ion-implanted into p-type semiconductor region 102 to realize the self-aligning formation of n-type semiconductor regions 103 and 104 in p-type semiconductor region 102 on two sides of selection electrode 106. The dosage of phosphorus that is ion-implanted is set to 2E+15 cm$^{-2}$.

Resistance-changing layer 107 is next formed on n-type semiconductor region 103, and resistance-changing layer 109 is formed on n-type semiconductor region 104.

Finally, wiring layer 108 is formed on resistance-changing layer 107, and wiring layer 110 is formed on resistance-changing layer 109.

Second Exemplary Embodiment

Figure 8:
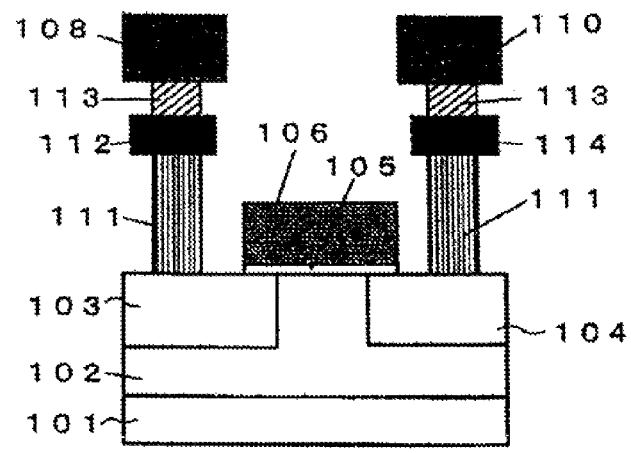
FIG. 8 is a sectional view showing the construction of the semiconductor storage device of the second exemplary embodiment.

FIG. 8 is a sectional view showing the construction of semiconductor storage device of the second exemplary embodiment of the present invention. In FIG. 8, constituent elements that are the same as elements in FIG. 5 are given the same reference numbers, and explanation of these elements may be omitted.

In the semiconductor storage device in FIG. 8, first via layer 111, first resistance-changing layer 112, second via layer 113, and first wiring layer 108 are connected in order to first n-type semiconductor region 103. Further, first via layer 111, second resistance-changing layer 114, second via layer 113, and second wiring layer 110 are connected in order to second n-type semiconductor region 104.

Accordingly, first resistance-changing layer 112 is connected to first n-type semiconductor region 103 with first via layer 111 interposed, and second resistance-changing layer 114 is connected to n-type semiconductor region 104 with first via layer 111 interposed. In addition, first wiring layer 108 is connected to first resistance-changing layer 112 with second via layer 113 interposed, and second wiring layer 110 is connected to second resistance-changing layer 114 with second via layer 113 interposed.

As in the first exemplary embodiment, the semiconductor storage device of the present exemplary embodiment constitutes a unit memory cell. Unit memory cells can make up a memory cell array similar to the memory cell array shown in FIG. 6. More specifically, a plurality of the semiconductor storage devices shown in FIG. 8 is arranged two-dimensionally as unit memory cells. In addition, p-type semiconductor regions 102 of the plurality of memory cells are linked and have electrical continuity with each other.

The materials of insulating film 105, selection electrode 106, resistance-changing layers 107 and 109, and wiring layers 108 and 110 are the same as in the first exemplary embodiment. Via layers 111 and 113 employ tungsten (W) that contains a TiN layer as an adhesive layer with the periphery.

The effects are next described.

According to the present exemplary embodiment, first resistance-changing layer 112 is connected to first n-type semiconductor region 103 with first via layer 111 interposed, and second resistance-changing layer 114 is connected to n-type semiconductor region 104 with first via layer 111 interposed. In addition, first wiring layer 108 is connected to first resistance-changing layer 112 with second via layer 113 interposed, and second wiring layer 110 is connected to second resistance-changing layer 114 with second via layer 113 interposed.

In this case, resistance-changing layers 112 and 114 are connected to n-type semiconductor regions 103 and 104 with via layer 111 interposed, and resistance-changing layers 112 and 114 can thus be further isolated from p-type semiconductor region 102 that generates hot carrier, whereby even higher reliability can be obtained.

In the present exemplary embodiment, as in the first exemplary embodiment, the interband tunnel current that flows in the PN junction of p-type semiconductor region 102 and n-type semiconductor region 103 below selection electrode 106 is used to enable writing and reading of memory information, whereby a source region need not be provided in the memory element. Accordingly, the present exemplary embodiment can also simultaneously realize higher reliability and reduced cell area per bit.

The fabrication method of the semiconductor storage device of the present exemplary embodiment is next described. FIGS. 9A-9G are sectional views showing sections of the semiconductor storage device at each step in this fabrication method.

Boron is first ion-implanted into a predetermined region of semiconductor substrate 101 and this region is then activated to form the region as p-type semiconductor region 102. The dosage of boron that is ion-implanted is assumed to be $2E+15$ $cm^{-2}$.

Figure 9A:
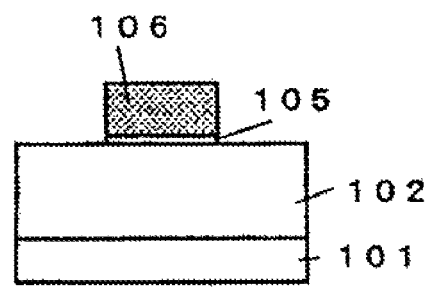
FIG. 9A is a sectional view for describing a step of the fabrication method of the semiconductor storage device of the second exemplary embodiment.

Next, as shown in FIG. 9A, insulating film 105 of $SiO_2$ and phosphorus-doped polycrystalline silicon are deposited on p-type semiconductor region 102, and the phosphorus-doped polycrystalline silicon is patterned using an exposure step and a dry-etching step to form the phosphorus-doped polycrystalline silicon as selection electrode 106.

Figure 9B:
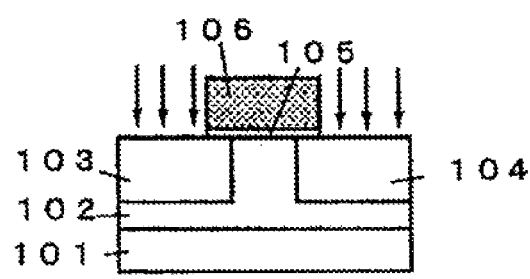
FIG. 9B is a sectional view for explaining another step of the fabrication method of the semiconductor storage device of the second exemplary embodiment.

Next, as shown in FIG. 9B, phosphorus is ion-implanted into p-type semiconductor region 102 with selection electrode 106 as a mask to implement self-aligning formation of n-type semiconductor regions 103 and 104 in p-type semiconductor region 102 at two sides of selection electrode 106. The dosage of phosphorus that is ion-implanted is assumed to be $2E+15$ $cm^{-2}$.

Figure 9C:
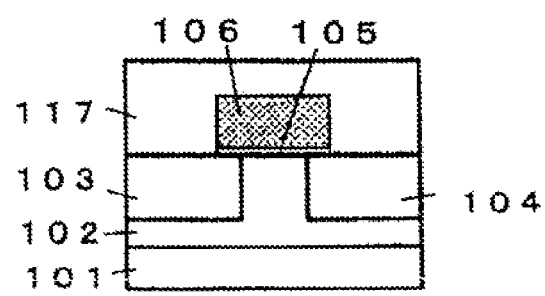
FIG. 9C is a sectional view for describing another step of the fabrication method of the semiconductor storage device of the second exemplary embodiment.

Further, as shown in FIG. 9C, first interlayer film 117 is deposited over the entire surface of the element, and the surface of deposited first interlayer film 117 is leveled using a CMP (Chemical Mechanical Polishing) method. An oxide film is here used as first interlayer film 117.

Figure 9D:
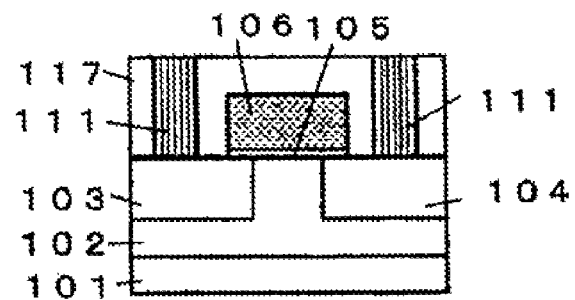
FIG. 9D is a sectional view for explaining another step of the fabrication method of the semiconductor storage device of the second exemplary embodiment.

An exposure step and dry-etching step are then used to open two vias in first interlayer film 117 that communicate with n-type semiconductor regions 103 and 104, respectively, and TiN and W, which are metals, are deposited in a predetermined order and thickness in these vias. Next, as shown in FIG. 9D, a CMP method is used to both level the surface of the deposits and remove TiN and W from areas other than vias and thus form first via layers 111 that connect to each of n-type semiconductor region 103 and 104.

Figure 9E:
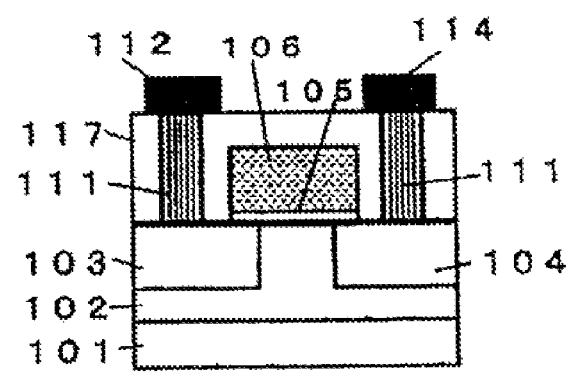
FIG. 9E is a sectional view for explaining another step of the fabrication method of the semiconductor storage device of the second exemplary embodiment.

Then, as shown in FIG. 9E, TiN, $TiO_2$, and TiN are deposited in order to a predetermined thickness on each of via layers 111, and these deposits are next patterned using an exposure step and a dry etching step to form first resistance-changing layer 112 and second resistance-changing layer 114 having a MIM structure. More specifically, first resistance-changing layer 112 is formed on via layer 111 that is connected to n-type semiconductor region 103, and second resistance-changing layer 114 is formed on via layer 111 that is connected to n-type semiconductor region 104.

Figure 9F:
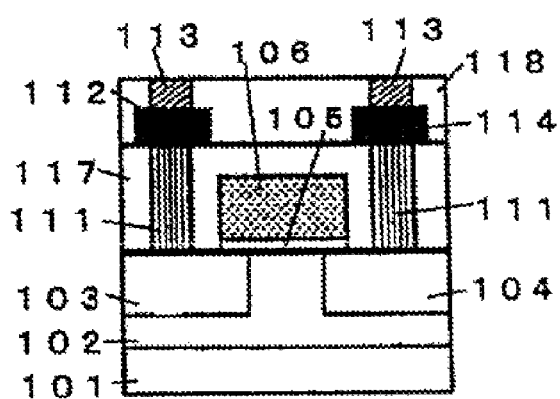
FIG. 9F is a sectional view for describing another step of the fabrication method of the semiconductor storage device of the second exemplary embodiment.

As shown in FIG. 9F, second interlayer film 118 is next deposited over the entire surface of the element, following which the surface of second interlayer film 118 is leveled by means of a CMP method, and second via layers 113 that connect to each of resistance-changing layers 112 and 114 is formed by the same steps as for first via layers 111. An oxide film is here used as second interlayer film 118. In addition, a layered construction of TiN and W is here used as second via layers 113.

Figure 9G:
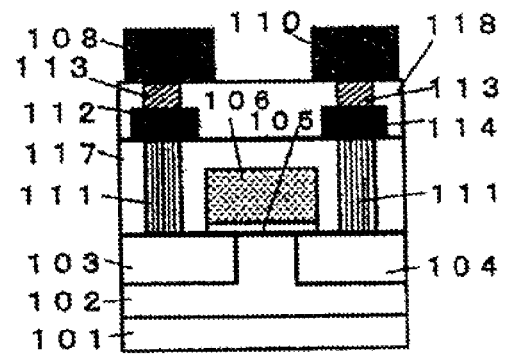
FIG. 9G is a sectional view for explaining another step of the fabrication method of the semiconductor storage device of the second exemplary embodiment.

Finally, as shown in FIG. 9G, Al is deposited over the entire surface of the element, and this deposit is patterned using an exposure step and a dry-etching step to form wiring layers 108 and 110. In this way, wiring layer 108 is formed on second via layer 113 that is connected to resistance-changing layer 112, and wiring layer 110 is formed on second via layer 113 that is connected to resistance-changing layer 114.

Third Exemplary Embodiment

Figure 10:
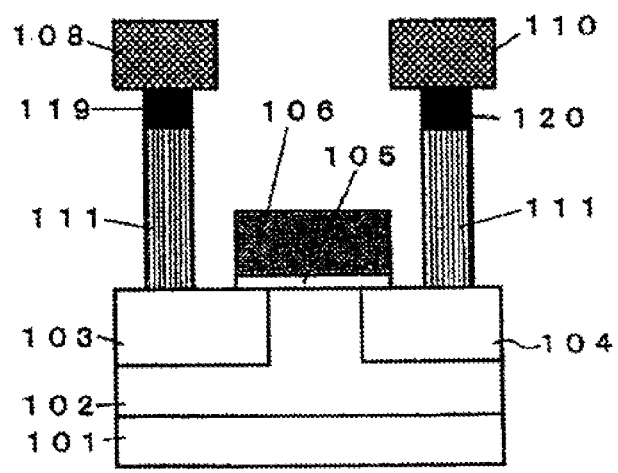
FIG. 10 is a sectional view showing the construction of the semiconductor storage device of the third exemplary embodiment.

FIG. 10 is a sectional view showing the construction of the semiconductor storage device of the third exemplary embodiment of the present invention. In FIG. 10, constituent elements that are the same as FIG. 8 are given the same reference numbers, and explanation of these elements may be here omitted.

In the semiconductor storage device in FIG. 10, first resistance-changing layer 119 is formed on first via layer 111 that is connected to first n-type semiconductor region 103, and first wiring layer 108 is formed on this resistance-changing layer 119. In addition, second resistance-changing layer 120 is formed on first via layer 111 that is connected to second s-type semiconductor region 104, and second wiring layer 110 is formed on this resistance-changing layer 120. In this way, each of resistance-changing layers 119 and 120 is connected to n-type semiconductor regions 103 and 104, respectively, with via layer 111 interposed. Wiring layers 108 and 110 are further directly connected to resistance-changing layers 119 and 120, respectively.

The semiconductor storage device of the present exemplary embodiment constitutes a unit memory cell, as in the first exemplary embodiment. Similar to the memory cell array shown in FIG. 6, the unit memory cells can make up a memory cell array. More specifically, a plurality of the semiconductor storage devices shown in FIG. 10 is arranged two-dimensionally as unit memory cells. In addition, p-type semiconductor regions 102 of the plurality of unit memory cells are formed linked and with electrical continuity to each other.

The materials of insulating film 105 and selection electrode 106 are the same as in the first exemplary embodiment, and the materials of via layers 111 are the same as in the second exemplary embodiment. As resistance-changing layers 119 and 120, a material obtained by oxidation of the upper portion of first via layer 111 (in this case, tungsten oxide (WO)) is used. As wiring layers 108 and 110, a laminated structure of TiN and Al is used.

The effect is next described.

According to the present exemplary embodiment, each of resistance-changing layers 119 and 120 is connected to n-type semiconductor regions 103 and 104, respectively, with via layer 111 interposed. As a result, as in the second exemplary embodiment, resistance-changing layer 119 can be further isolated from p-type semiconductor region 102 that generates a hot carrier, whereby greater high reliability can be obtained. In the present exemplary embodiment, as in the first and second exemplary embodiments, writing and reading of memory information are enabled by using the interband tunnel current that flows in the PN junction of p-type semiconductor region 102 and n-type semiconductor region 103 below selection electrode 106, whereby a source region need not be provided in the memory element. Accordingly, the present exemplary embodiment also enables both higher reliability and reduced cell area per bit.

In the present exemplary embodiment, wiring layers 108 and 110 are each directly connected to resistance-changing layers 119 and 120, respectively. Via layer 111 therefore also serves as a lower electrode and wiring layers 108 and 110 also serve as upper electrodes, thereby enabling a simplification of the fabrication method. In addition, because second via layers 113 shown in FIG. 8 need not be provided, the scale of the vertical direction of the semiconductor storage device can be reduced.

In the present exemplary embodiment, a material in which first via layer 111 is oxidized is used for resistance-changing layers 119 and 120. As a result, via layer 111 need only be oxidized when forming resistance-changing layers 119 and 120, thus enabling a further simplification of the fabrication method.

For these reasons, a substantial decrease in cost can be obtained when using the semiconductor storage device of the present exemplary embodiment.

The fabrication method of the semiconductor storage device of the present exemplary embodiment is next described. FIGS. 11A-11F are sectional views showing sections of the semiconductor storage device in each step in the fabrication method.

Boron is first ion-implanted into a predetermined region of semiconductor substrate 101 and this area is then activated to form the region as p-type semiconductor region 102. The dosage of the boron that is ion-implanted is assumed to be $2E+15$ cm$^{-2}$, as in the second exemplary embodiment.

Figure 11A:
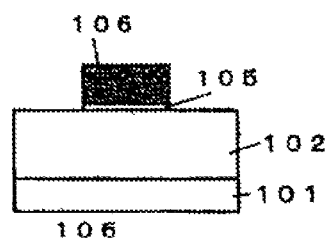
FIG. 11A is a sectional view for explaining a step of the fabrication method of the semiconductor storage device of the third exemplary embodiment.

Next, as shown in FIG. 11A, insulating film 105 of $SiO_2$ and phosphorus-doped polycrystalline silicon are deposited on p-type semiconductor region 102, and the phosphorus-doped polycrystalline silicon is patterned using an exposure step and a dry-etching step to form the phosphorus-doped polycrystalline silicon as selection electrode 106.

Figure 11B:
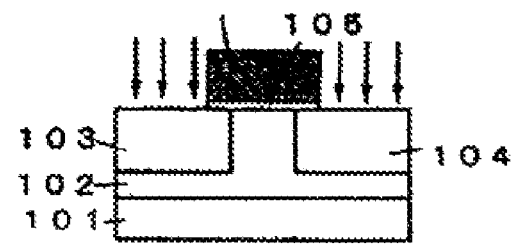
FIG. 11B is a sectional view for explaining another step of the fabrication method of the semiconductor storage device of the third exemplary embodiment.

Then, as shown in FIG. 11B, phosphorus is ion-implanted into p-type semiconductor region 102 with selection electrode 106 as a mask to implement the self-aligning formation of n-type semiconductor regions 103 and 104 in p-type semiconductor region 102 at two sides of selection electrode 106. The dosage of the phosphorus that is ion-implanted is assumed to be $2E+15$ cm$^{-2}$. The dosage of the phosphorus that is ion-implanted is assumed to be $2E+15$ cm$^{-2}$, as in the second exemplary embodiment.

Figure 11C:
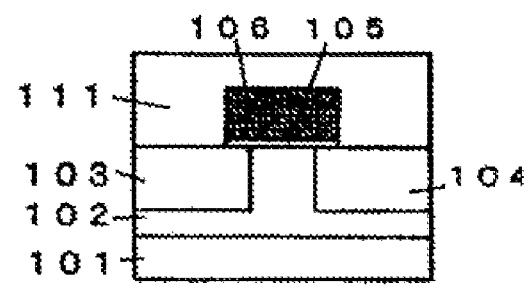
FIG. 11C is a sectional view for explaining another step of the fabrication method of the semiconductor storage device of the third exemplary embodiment.

As shown in FIG. 11C, first interlayer film 117 is deposited over the entire surface of the element, and the surface of first interlayer film 117 that has been deposited is leveled by using a CMP method. In this case, an oxide film is used as first interlayer film 117.

Figure 11D:
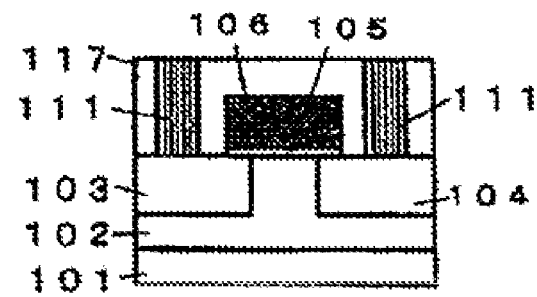
FIG. 11D is a sectional view for explaining another step of the fabrication method of the semiconductor storage device of the third exemplary embodiment.

Next, an exposure step and a dry-etching step are used to open two vias in first interlayer film 117 that communicate with n-type semiconductor regions 103 and 104, respectively, and TiN and W are then deposited in these vias. Then, as shown in FIG. 11D, a CMP method is used to both level the surface of the deposit and remove TiN and W from areas other than the vias to form first via layers 111 that connect to each of n-type semiconductor region 103 and n-type semiconductor region 104.

Figure 11E:
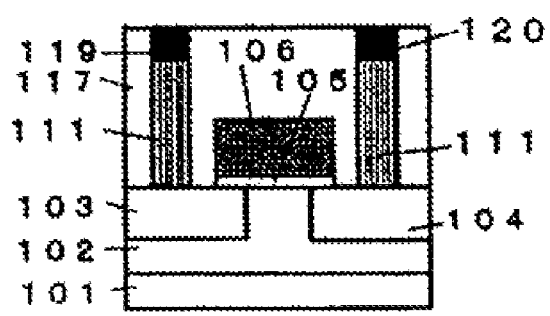
FIG. 11E is a sectional view for explaining another step of the fabrication method of the semiconductor storage device of the third exemplary embodiment.

Next, as shown in FIG. 11E, the upper portions of first via layers 111 are subjected to plasma oxidation to oxidize the upper portions of this first via layer 111 to form WO and thus form this WO as first resistance-changing layer 119 and second resistance-changing layer 120.

Figure 11F:
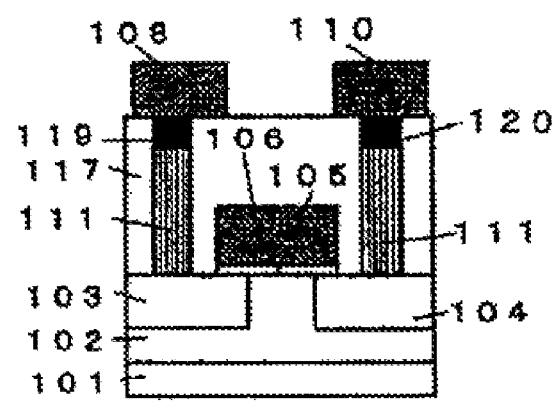
FIG. 11F is a sectional view for explaining another step of the fabrication method of the semiconductor storage device of the third exemplary embodiment.

Finally, as shown in FIG. 11F, TiN and Al are deposited in order to a predetermined thickness over the entire surface of the element, and an exposure step and dry-etching step are then used to pattern this deposit and form wiring layers 108 and 110.

The fabrication method of the present exemplary embodiment, compared to the fabrication method of the second exemplary embodiment shown in FIG. 9, allows the omission of the patterning process of the MIM structures that are resistance-changing layers 119 and 120, the process of forming a second interlayer film, and the process of forming a second via layer, and thus enables a substantial decrease of the number of steps and a substantial reduction of cost.

Fourth Exemplary Embodiment

Figure 12:
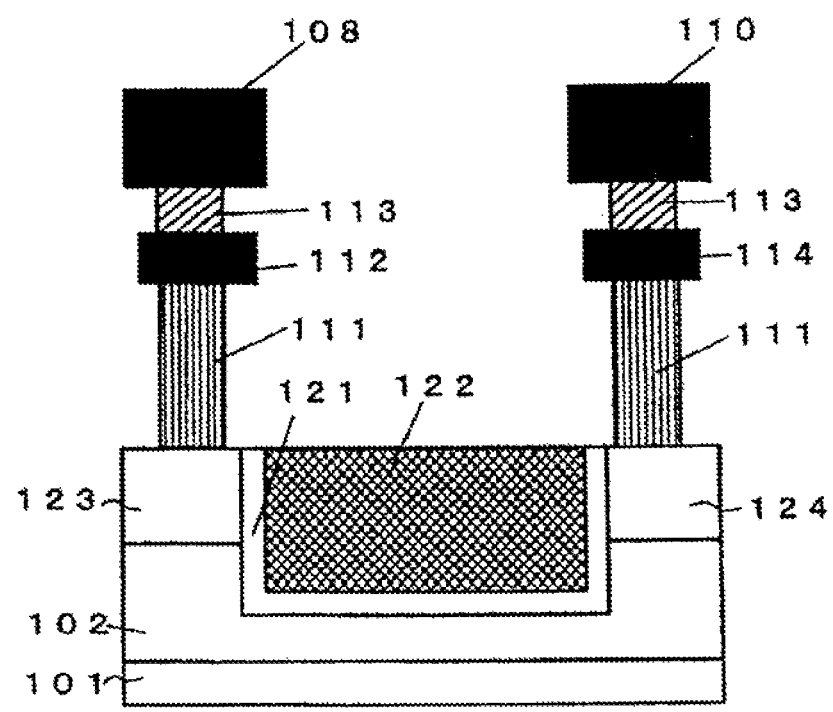
FIG. 12 is a sectional view showing the construction of the semiconductor storage device of the fourth exemplary embodiment.

FIG. 12 is a sectional view showing the construction of the semiconductor storage device of the fourth exemplary embodiment of the present invention. In FIG. 12, constituent elements that are the same as in FIG. 8 are given the same reference numbers and explanation of these elements may be omitted. In addition, the semiconductor storage device in FIG. 12 is characterized by embedding of selection electrode in the semiconductor substrate.

In the semiconductor storage device in FIG. 12, p-type semiconductor region 102 is formed on semiconductor substrate 101, and embedded selection electrode 122 is embedded in p-type semiconductor region 102 with insulating film 121 interposed. In addition, self-aligning formation is implemented to form first n-type semiconductor region 123 and second n-type semiconductor region 124 in p-type semiconductor region 102 at both sides of embedded selection electrode 122. Selection electrode 122 is connected to a wordline. First via layer 111, first resistance-changing layer 112, second via layer 113, and wiring layer 108 are formed in order on first n-type semiconductor region 123. First via layer 111, second resistance-changing layer 114, second via layer 113, and wiring layer 110 are formed in order on second n-type semiconductor region 124.

The semiconductor storage device of the present exemplary embodiment constitutes a unit memory cell similar to the first exemplary embodiment. In addition, unit memory cells can make up a memory cell array similar to the memory cell array shown in FIG. 6. More specifically, a plurality of the semiconductor storage devices shown in FIG. 12 is aligned two-dimensionally as unit memory cells. P-type semiconductor regions 102 of the plurality of unit memory cells are formed linked and with electrical continuity to each other.

The materials of via layers 111 and 113, resistance-changing layers 112 and 114, and wiring layers 108 and 110 are the same as in the second exemplary embodiment. In addition, insulating film 121, as with insulating film 105 of FIG. 5, is preferably formed of a material that does not trap electrons, and is preferably $SiO_2$, SiON, $HfO_2$, HfSiO, HfSiON, $Al_2O_3$, or $ZrO_2$. In the following explanation, a $SiO_2$ film is used as insulating film 121. As with selection electrode 106 shown in FIG. 5, phosphorus-doped n-type polycrystalline silicon is used as selection electrode 122.

The effects are next described.

In the present exemplary embodiment, as in the first to third exemplary embodiments, resistance-changing layers 112 and 114 that have memory capability can be isolated from p-type semiconductor region 102 that generates a hot carrier. As a result, Read Disturb and the deterioration of the reliability of retaining capabilities can be avoided. In the present exemplary embodiment, moreover, as in the first to third exemplary embodiments, the interband tunnel current that flows in the PN junction of p-type semiconductor region 102 and n-type semiconductor region 103 below embedded selection electrode 106 is used to enable writing and reading of memory information, whereby a source region need not be provided in the memory element. Accordingly, the present exemplary embodiment is also able to simultaneously obtain higher reliability and decreased cell area per bit.

In the present exemplary embodiment, embedded selection electrode 122 is embedded in p-type semiconductor region 102. As a result, the effective distance between n-type semiconductor regions 123 and 124 can be increased, whereby miniaturization is enabled while suppressing leakage current that flows between right and left memory nodes and that causes malfunctioning.

Still further, as with the semiconductor storage device of the third exemplary embodiment shown in FIG. 10, wiring layers 108 and 110 can be formed directly on resistance-changing layers 112 and 114, respectively, without providing second via layer 113.

The fabrication method of the semiconductor storage device of the present exemplary embodiment is next described. FIGS. 13A-13H are sectional views showing sections of the semiconductor storage device at each step in this fabrication method.

Boron is first ion-implanted into a predetermined region of semiconductor substrate 101 and this area is then activated to form the region as p-type semiconductor region 102. The dosage of boron that is ion-implanted is assumed to be 2E+15 $cm^{-2}$, as in the third and fourth exemplary embodiments.

Figure 13A:
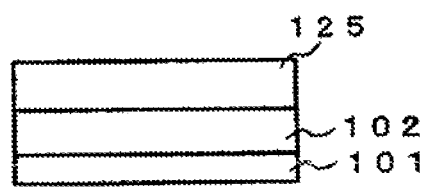
FIG. 13A is a sectional view for explaining a step of the fabrication method of the semiconductor storage device of the fourth exemplary embodiment.

Next, as shown in FIG. 13A, phosphorus is implanted into a predetermined area on p-type semiconductor region 102 and this area is then activated to form the region into which phosphorus was implanted as n-type semiconductor region 125.

Figure 13B:
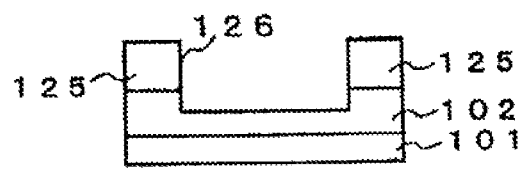
FIG. 13B is a sectional view for explaining another step of the fabrication method of the semiconductor storage device of the fourth exemplary embodiment.
Figure 13C:
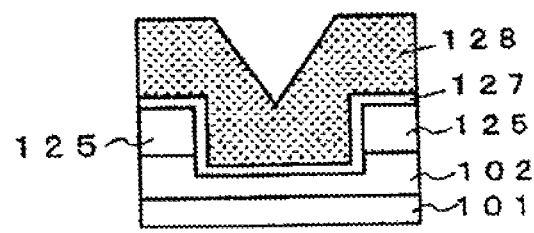
FIG. 13C is a sectional view for explaining another step of the fabrication method of the semiconductor storage device of the fourth exemplary embodiment.

Then, as shown in FIG. 13B, an exposure step and a dry-etching step are used to pattern semiconductor substrate 101 to form trench 126 in p-type semiconductor region 102 and n-type semiconductor region 125 of semiconductor substrate 101. Insulating film 127 of $SiO_2$ and phosphorus-doped polycrystalline silicon 128 are next deposited in order to a predetermined thickness over the entire surface of the element in which trench 126 was formed as shown in FIG. 13C.

Insulating film 127 and phosphorus-doped polycrystalline silicon 128 on n-type semiconductor region 125 are then removed and a CMP method is used to level n-type semiconductor region 125. In this way, as shown in FIG. 13D, not only is embedded selection electrode 122 made from phosphorus-doped polycrystalline silicon 128 formed on p-type semiconductor region 102 with interposed insulating film 121 made from insulating film 127, but first n-type semiconductor region 123 and second n-type semiconductor region 124 produced from n-type semiconductor region 125 are also formed on both sides of embedded selection electrode 122.

Figure 13D:
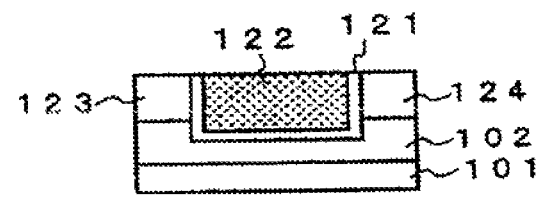
FIG. 13D is a sectional view for explaining another step of the fabrication method of the semiconductor storage device of the fourth exemplary embodiment.

Next, as shown in FIG. 13D, first interlayer film 117 is deposited over the entire surface of the element, and the surface of first interlayer film that is deposited is leveled by using a CMP method. An oxide film is here used as first interlayer film 117.

Figure 13E:
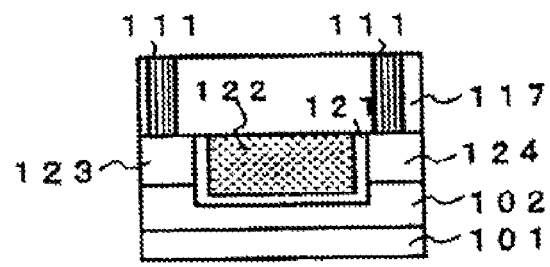
FIG. 13E is a sectional view for explaining another step of the fabrication method of the semiconductor storage device of the fourth exemplary embodiment.

By further using an exposure step and a dry-etching step on first interlayer film 117, vias are opened that communicate with n-type semiconductor regions 123 and 124, and TiN and W are deposited in a predetermined order and to a predetermined thickness in these vias. Next, as shown in FIG. 13E, the surfaces of these deposits are leveled by a CMP method and TiN and W are removed from areas other than the vias to form first via layers 111 connected to each of n-type semiconductor region 123 and n-type semiconductor region 124.

Figure 13F:
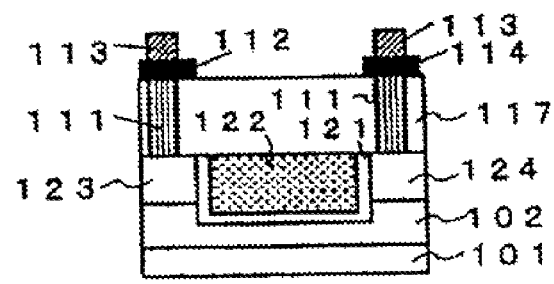
FIG. 13F is a sectional view for explaining another step of the fabrication method of the semiconductor storage device of the fourth exemplary embodiment.

Then, as shown in FIG. 13F, TiN, $TiO_2$, and TiN are next deposited in this order and to a predetermined thickness over the entire surface of the element and an exposure step and dry-etching step are used to pattern these deposits and thus form first resistance-changing layer 113 and second resistance-changing layer 114 that have an MIM structure.

Figure 13G:
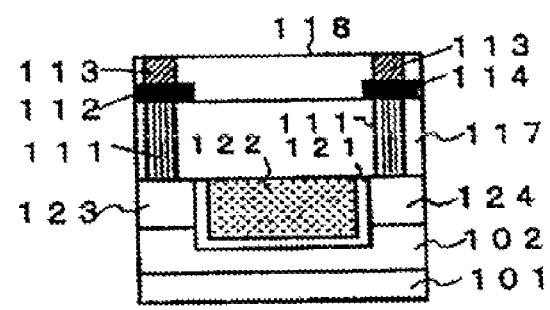
FIG. 13G is a sectional view for explaining another step of the fabrication method of the semiconductor storage device of the fourth exemplary embodiment.

Next, as shown in FIG. 13G, second interlayer film 118 is deposited over the entire surface of the element, and the surface of second interlayer film 118 that has been deposited is leveled using a CMP method and second via layers 113 formed by the same steps as for first via layers 111. An oxide film is here used as second interlayer film 118. In addition, a laminated structure of TiN and W is used as second via layers 113.

Figure 13H:
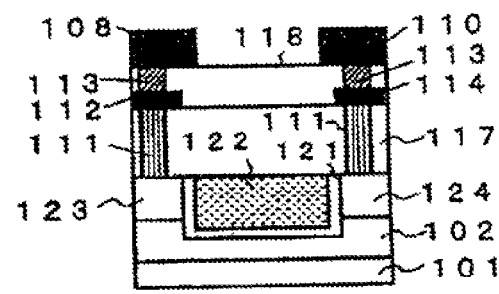
FIG. 13H is a sectional view for explaining another step of the fabrication method of the semiconductor storage device of the fourth exemplary embodiment.

Finally, as shown in FIG. 13H, Al is deposited over the entire surface of the element and an exposure step and dry-etching step are used to pattern this deposit to form wiring layers 108 and 110.

Fifth Exemplary Embodiment

Figure 14:
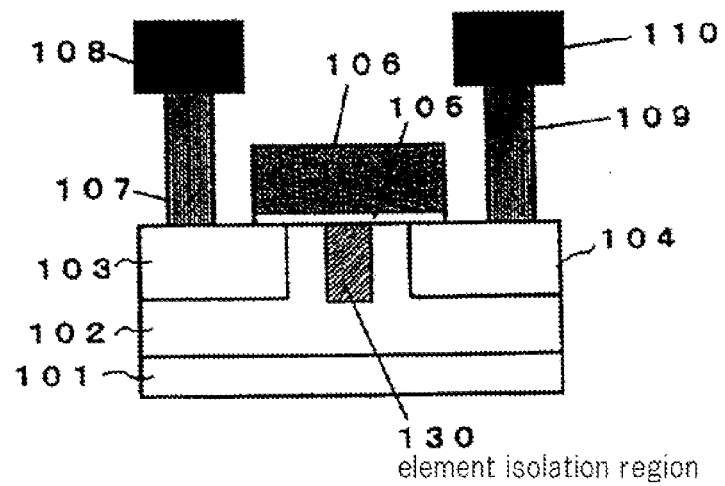
FIG. 14 is a sectional view showing the construction of the semiconductor storage device of the fifth exemplary embodiment.

FIG. 14 is a sectional view showing the construction of the semiconductor storage device of the fifth exemplary embodiment of the present invention. In FIG. 14, constituent elements that are the same as elements in FIG. 5 are given the same reference numbers and explanation of these elements may be omitted.

As shown in FIG. 14, in the semiconductor storage device of the present exemplary embodiment, element isolation region 130 is formed between first n-type semiconductor region 103 and second n-type semiconductor region 104 in p-type semiconductor region 102.

Parts other than element isolation region 130 are identical to the first exemplary embodiment.

In addition, the semiconductor storage device of the present exemplary embodiment constitutes a unit memory cell, as in the first exemplary embodiment. Unit memory cells can make up a memory cell array similar to the memory cell array shown in FIG. 6. More specifically, a plurality of the semiconductor storage devices shown in FIG. 14 are aligned two-dimensionally as unit memory cells. In addition, the plurality of p-type semiconductor regions 102 of the unit memory cells are formed linked and with electrical continuity with each other.

In the fabrication method of the semiconductor storage device of the present exemplary embodiment, element isolation region 130 is formed in p-type semiconductor region 102 before forming selection electrode 106. Then, after forming element isolation region 130, selection electrode 106 is formed on element isolation region 130.

The effects are next described.

As in the first to fourth exemplary embodiments, the present exemplary embodiment has two memory nodes for one selection electrode 106 and can therefore substantially reduce the memory cell area per bit compared to a resistance-changing memory element that has only one memory node for one selection electrode 106.

In addition, the formation of element isolation region 130 between n-type semiconductor regions 103 and 104 in the present exemplary embodiment enables a substantial reduction of the leakage current between n-type semiconductor regions 103 and 104 and can thus prevent malfunctioning.

Although the invention of the present application has been described hereinabove with reference to exemplary embodiments, the invention of the present application is not limited to these exemplary embodiments. The configuration and details of the invention of the present application are open to various modifications within the scope of the invention of the present application that will be understood by one of ordinary skill in the art.

For example, in each of the exemplary embodiments, p type was used as the first conductive type and n type was used as the second conductive type, but n type may also be used as the first conductive type and p type may also be used as the second conductive type. In the operation method in this case, voltages of the polarities that are opposite to those of each exemplary embodiment are applied to each of the semiconductor regions.

In addition, as the resistance-changing layer, a phase-changing layer may be used in place of the MIM structure. In this case as well, higher reliability and decreased cell area can be simultaneously obtained.

This application is the National Phase of PCT/JP2009/055737, filed Mar. 24, 2009, which claims priority based on JP-A-2008-79069 for which application was submitted on Mar. 25, 2008 and incorporates all of the disclosures of that application.

What is claimed is:

1. A semiconductor storage device comprising:
   a semiconductor region of a first conductivity type;
   a selection electrode connected with said semiconductor region with an insulating film interposed;
   a first semiconductor region and second semiconductor region of a second conductivity type formed in said semiconductor region at two sides of said selection electrode;
   a first resistance-changing layer connected to said first semiconductor region;
   a second resistance-changing layer connected to said second semiconductor region;
   a first wiring layer connected to said first resistance-changing layer; and
   a second wiring layer connected to said second resistance-changing layer,
   wherein the concentration of impurities of a first conductivity type in said semiconductor region is at least $1E+18$ $cm^{-2}$, and the concentration of impurities in said first semiconductor region and in said second semiconductor region is at least $1E+18$ $cm^{-2}$.

2. The semiconductor storage device as set forth in claim 1, wherein said first resistance-changing layer and said second resistance-changing layer are connected to said first semiconductor region and said second semiconductor region, respectively, with first via layers interposed.

3. The semiconductor storage device as set forth in claim 2, wherein said first wiring layer and said second wiring layer are connected to said first resistance-changing layer and said second resistance-changing layer, respectively, with second via layers interposed.

4. The semiconductor storage device as set forth in claim 1, wherein said selection electrode is embedded in said semiconductor region.

5. The semiconductor storage device as set forth in claim 1, wherein an element isolation region is formed between said first semiconductor region and said second semiconductor region in said semiconductor region.

6. The semiconductor storage device as set forth in claim 1, wherein said first resistance-changing layer and said second resistance-changing layer have an MIM structure in which an insulating layer is sandwiched by metals.

7. The semiconductor storage device as set forth in claim 1, wherein said first resistance-changing layer and said second resistance-changing layer are phase-changing layers.

8. The semiconductor storage device as set forth in claim 1, wherein the concentration of impurity of a first conductivity type in said semiconductor region is at least $1E+19$ $cm^{-2}$, and the concentration of impurity in said first semiconductor region and in said second semiconductor region is at least $1E+19$ $cm^{-2}$.

9. A memory cell array having the semiconductor storage devices as set forth in claim 1 as unit memory cells, and further, having a plurality of bit-lines and a plurality of word-lines, wherein a plurality of said unit memory cells is aligned in each of the direction of extension of said bit-lines and the direction of extension of said word-lines, selection electrodes of memory cells are connected to said word-lines, first wiring layer and second wiring layers of memory cells are connected to said bit-lines, and
   the semiconductor regions of said unit memory cells are linked, and moreover, have electrical continuity with each other.

10. A fabrication method of a semiconductor storage device, comprising:
   forming a semiconductor region of a first conductivity type in a semiconductor layer;
   forming a selection electrode that connects with said semiconductor region with an insulating film interposed and forming a first semiconductor region and second semiconductor region of a second conductivity type in the semiconductor region on two sides of said selection electrode;
   forming a first resistance-changing layer on said first semiconductor region and forming a second resistance-changing layer on said second semiconductor region; and
   forming a first wiring layer on said first resistance-changing layer and forming a second wiring layer on said second resistance-changing layer,
   wherein the concentration of impurities of a first conductivity type in said semiconductor region is at least $1E+18$ $cm^{-2}$, and the concentration of impurities in said first semiconductor region and in said second semiconductor region is at least $1E+18$ $cm^{-2}$.

11. The fabrication method of a semiconductor storage device as set forth in claim 10, wherein said forming a first resistance-changing layer includes:
   depositing a first interlayer film, opening vias in the first interlayer film that communicate with said first semiconductor region and said second semiconductor region, respectively, and depositing a metal in each via to form first via layers that connect with each of said first semiconductor region and said second semiconductor region; and
   forming said first resistance-changing layer on a first via layer that connects with said first semiconductor region, and forming said second resistance-changing layer on a first via layer that connects with said second semiconductor region.

12. The fabrication method of a semiconductor storage device as set forth in claim 11, wherein said forming a first wiring layer includes:
   depositing a second interlayer film, opening vias in the second interlayer film that communicate with said first resistance-changing layer and said second resistance-changing layer, respectively, and depositing a metal in each via to form second via layers that connect with each of said first resistance-changing layer and said second resistance-changing layer; and
   forming said first wiring layer on a second via layer that is connected to said first resistance-changing layer, and forming said second wiring layer on a second via layer that is connected to said second resistance-changing layer.

13. The fabrication method of a semiconductor storage device as set forth claim 10, wherein said forming a selection electrode includes:
   forming said selection electrode on said semiconductor region with said insulating film interposed; and
   ion-implanting an impurity of a second conductivity type in said semiconductor region with said selection electrode as a mask to realize self-aligning formation of said first semiconductor region and said second semiconductor region of said second conductivity type.

14. The fabrication method of a semiconductor storage device as set forth in claim 10, wherein said forming a selection electrode includes:
   ion-implanting an impurity of a second conductivity type in said semiconductor region and forming an impurity region of the second conductivity type in said semiconductor region;
   forming a trench in a predetermined region of said semiconductor region and said impurity region; and
   both forming a selection electrode in said trench with said insulating film interposed and forming said impurity region as said first semiconductor region and said second semiconductor region.

15. The fabrication method of a semiconductor storage device as set forth in claim 10, wherein forming a selection electrode includes forming an element isolation region in said semiconductor region and then forming said selection electrode on said element isolation region.

16. The fabrication method of a semiconductor storage device as set forth in claim 10, wherein said first resistance-changing layer and said second resistance-changing layer have an MIM structure in which an insulating layer is sandwiched by metal.

17. The fabrication method of a semiconductor storage device as set forth in claim 10, wherein said first resistance-changing layer and said second resistance-changing layer have phase-changing layers.

18. A drive method of the semiconductor storage device according to claim 1, comprising: carrying out reading or writing of information by taking the potential of said semiconductor region as a reference potential, by applying a read voltage of reversed polarities to said selection electrode and said first wiring layer or said second wiring layer that is connected to, of said first resistance-changing layer and said second resistance-changing layer, the resistance-changing layer that implements reading or writing of information.

* * * * *